(12) United States Patent
Sugiyama et al.

(10) Patent No.: US 9,390,900 B2
(45) Date of Patent: Jul. 12, 2016

(54) MASS SPECTROMETER

(75) Inventors: Masuyuki Sugiyama, Hino (JP);
Yuichiro Hashimoto, Tachikawa (JP);
Hideki Hasegawa, Tachikawa (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 13/574,788

(22) PCT Filed: Jan. 21, 2011

(86) PCT No.: PCT/JP2011/000300
§ 371 (c)(1),
(2), (4) Date: Jul. 24, 2012

(87) PCT Pub. No.: WO2011/089912
PCT Pub. Date: Jul. 28, 2011

(65) Prior Publication Data
US 2012/0292501 A1    Nov. 22, 2012

(30) Foreign Application Priority Data
Jan. 25, 2010    (JP) .................................. 2010-012755

(51) Int. Cl.
*H01J 49/16*    (2006.01)
*H01J 49/10*    (2006.01)
*H05H 1/24*    (2006.01)

(52) U.S. Cl.
CPC ............ *H01J 49/105* (2013.01); *H05H 1/2406* (2013.01); *H05H 2001/2443* (2013.01)

(58) Field of Classification Search
CPC ... H01J 49/04; H01J 49/0404; H01J 49/0422; H01J 49/10; H01J 49/105; H01J 49/14; H01J 49/147

USPC .................................. 250/281, 282, 288, 289
See application file for complete search history.

(56) References Cited

U.S. PATENT DOCUMENTS

| 4,849,628 | A  | * | 7/1989  | McLuckey et al. ............ 250/282 |
| 6,753,523 | B1 | * | 6/2004  | Whitehouse .......... H01J 49/005 |
|           |    |   |         |                          250/292 |
| 7,064,320 | B2 |   | 6/2006  | Yamada et al. |
| 2003/0070913 | A1 | * | 4/2003 | Miller et al. ................. 204/192.1 |
| 2005/0168907 | A1 | * | 8/2005 | Sekoguchi et al. ........... 361/230 |
| 2006/0097185 | A1 | * | 5/2006 | Mack .................... H01J 27/026 |
|           |    |   |         |                          250/423 R |
| 2007/0075051 | A1 |   | 4/2007 | Morrisore |
| 2008/0156981 | A1 | * | 7/2008 | Miller ...................... H05H 1/24 |
|           |    |   |         |                          250/287 |
| 2009/0278038 | A1 |   | 11/2009 | Baumbach et al. |

(Continued)

FOREIGN PATENT DOCUMENTS

| JP | 2005-512274 | 4/2005 |
| JP | 2008-537282 | 9/2008 |

(Continued)

OTHER PUBLICATIONS

Cato Brede et al., Microplasma Mass Spectrometric Detection in Capillary Gas Chromatography, Analytical Chemistry, Feb. 1, 1998, pp. 513-517, vol. 70, No. 3.

*Primary Examiner* — Nicole Ippolito
*Assistant Examiner* — David E Smith
(74) *Attorney, Agent, or Firm* — Baker Botts L.L.P.

(57) ABSTRACT

A mass spectrometer of ionizing a sample by a dielectric barrier discharge under a reduced pressure. An ionization with inconsiderable fragmentation can be carried out highly sensitively by the present invention.

18 Claims, 15 Drawing Sheets

(56) References Cited

U.S. PATENT DOCUMENTS

| | | | |
|---|---|---|---|
| 2009/0294649 A1* | 12/2009 | Shabanowitz | H01J 49/12 250/282 |
| 2010/0171042 A1* | 7/2010 | Kellerman | H01J 37/12 250/396 R |
| 2010/0258717 A1* | 10/2010 | Chen | H01J 49/0431 250/288 |
| 2011/0042560 A1* | 2/2011 | Ouyang | H01J 49/105 250/282 |
| 2011/0108726 A1* | 5/2011 | Hiraoka | H01J 49/105 250/282 |
| 2011/0240844 A1* | 10/2011 | Ouyang | H01J 49/0404 250/282 |

FOREIGN PATENT DOCUMENTS

| | | |
|---|---|---|
| JP | 2009-059627 | 3/2009 |
| WO | WO 03/015120 A1 | 2/2003 |
| WO | WO 2006/099190 A2 | 9/2006 |
| WO | WO 2008/153199 A1 | 12/2008 |
| WO | WO 2009/102766 A1 | 8/2009 |
| WO | WO 2009/119050 A1 | 10/2009 |
| WO | WO 2009/157312 A1 | 12/2009 |

* cited by examiner

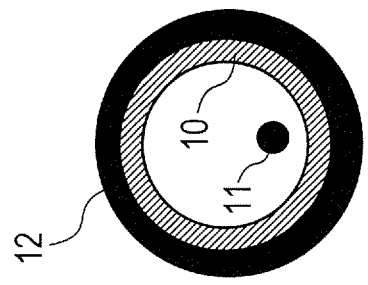
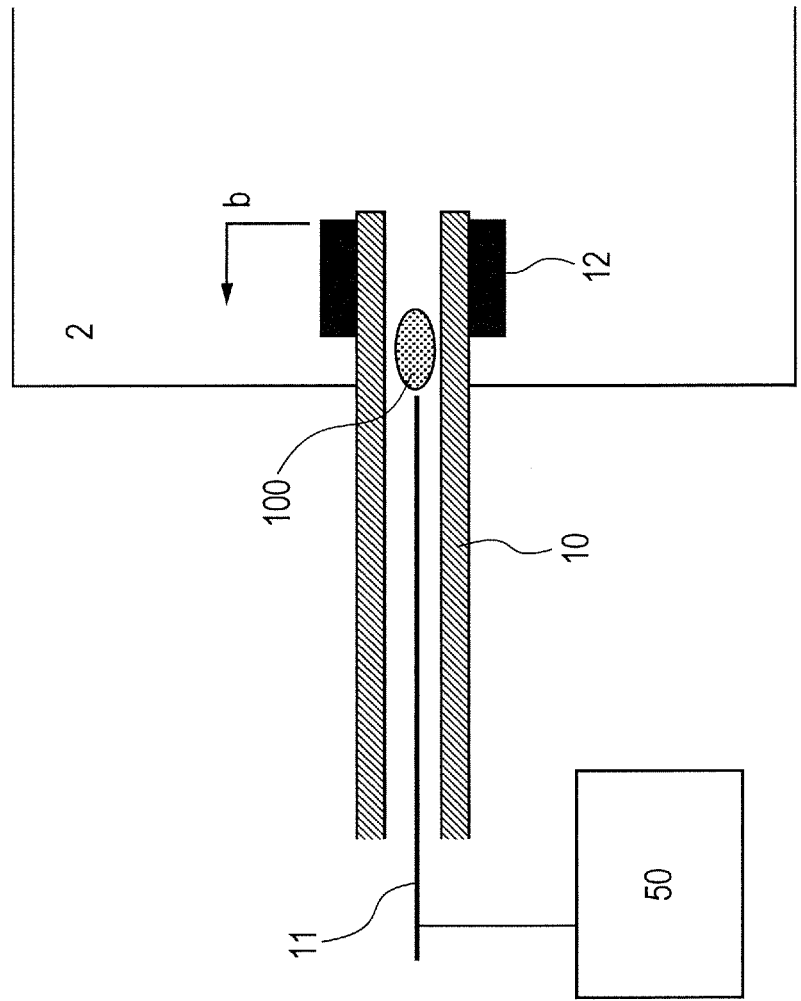

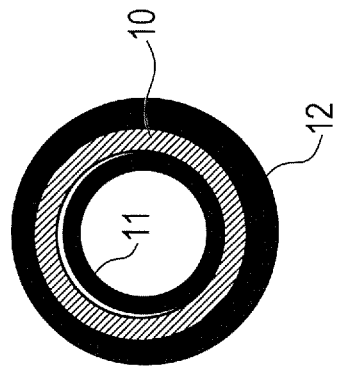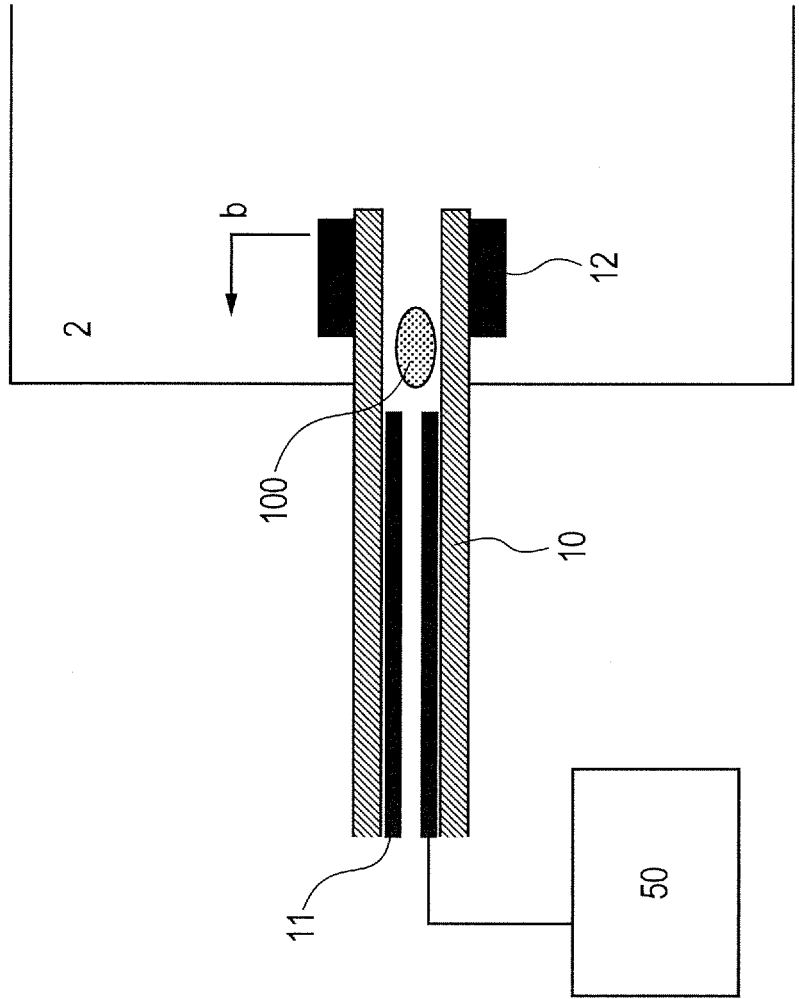

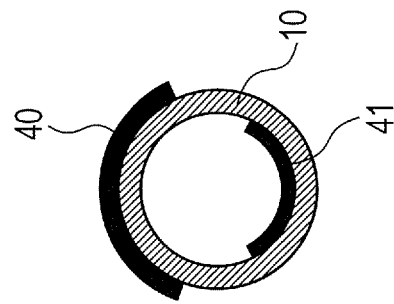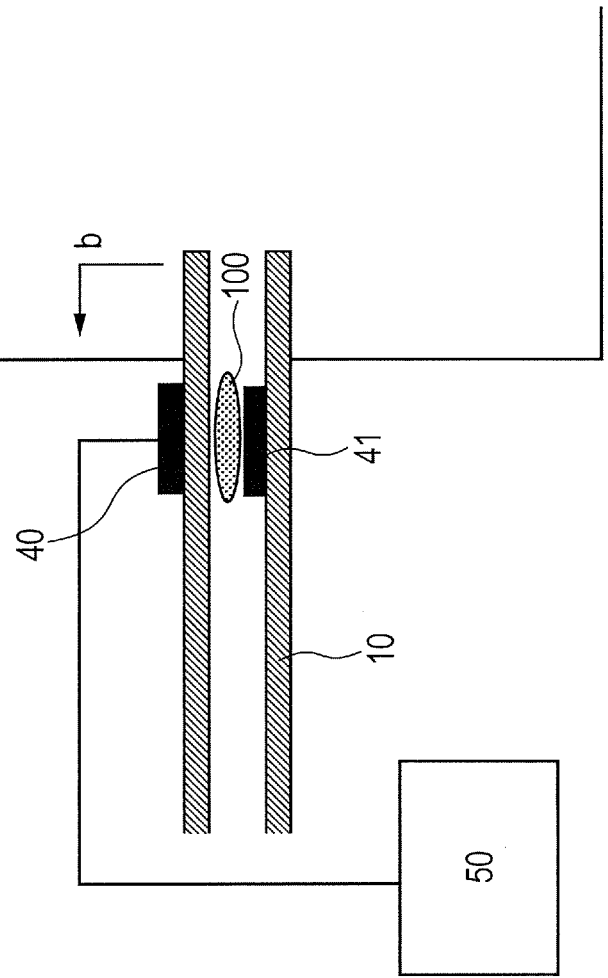

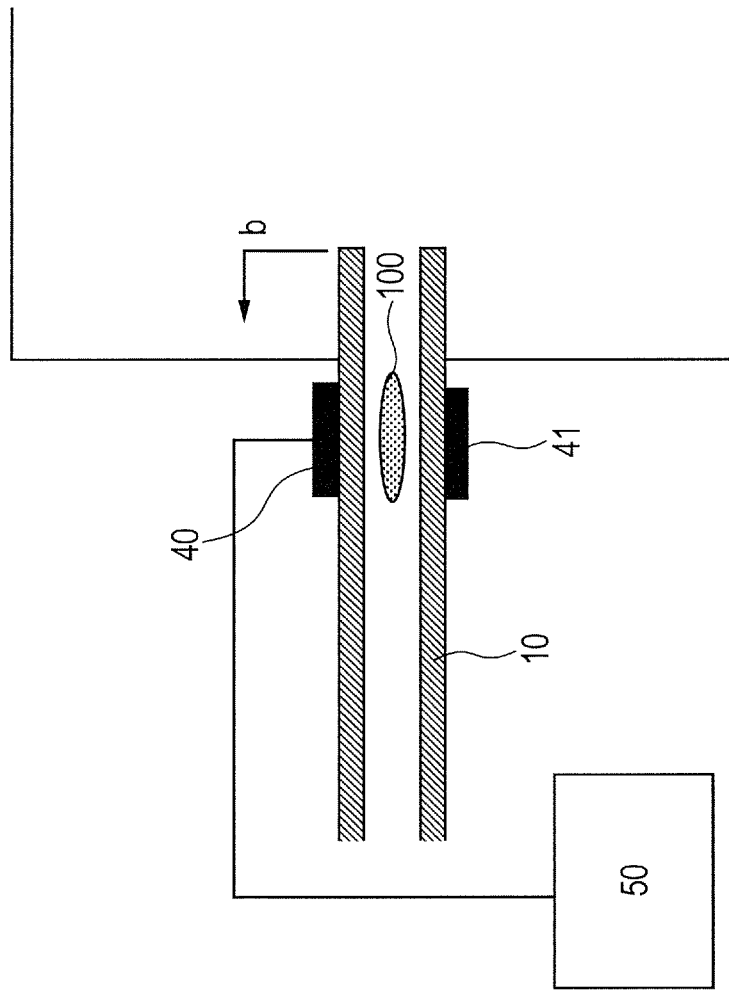
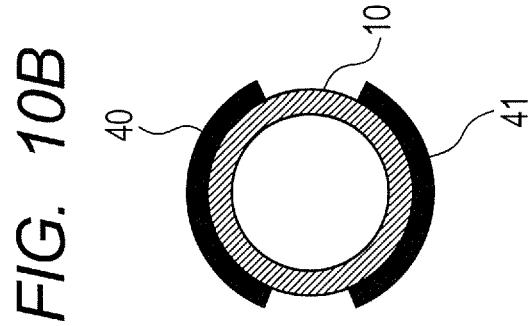

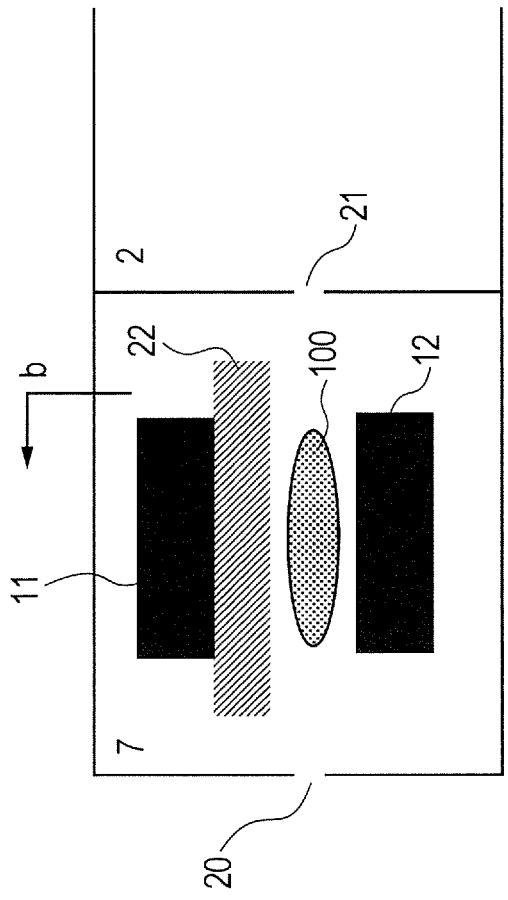
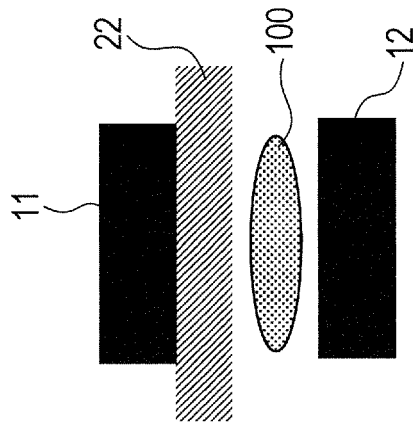
FIG. 12A
FIG. 12B

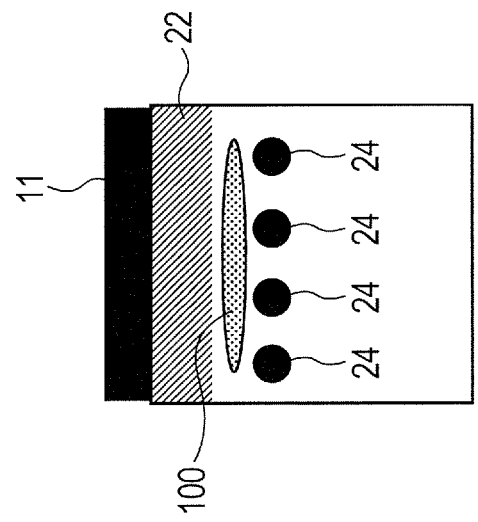
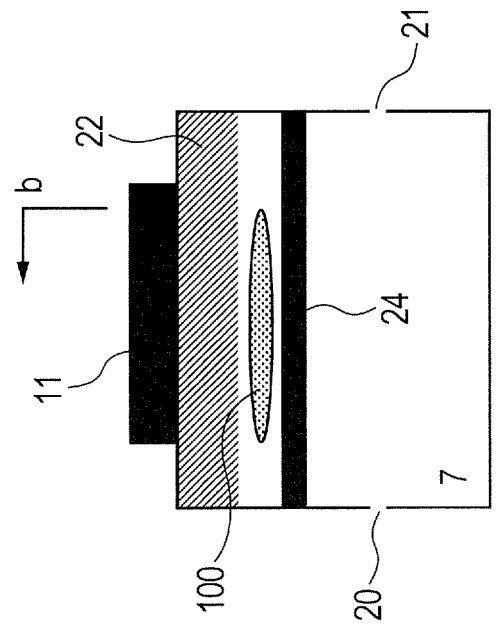

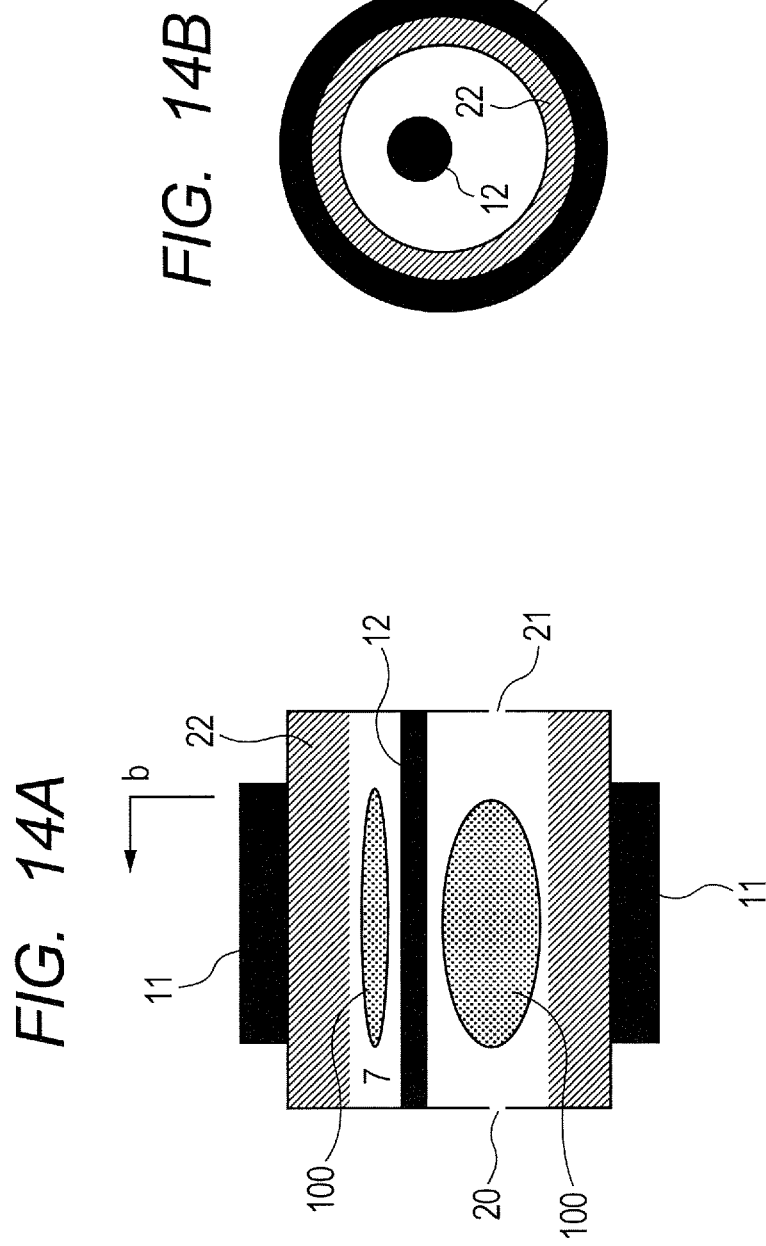

MASS SPECTROMETER

TECHNICAL FIELD

The present invention relates to a mass spectrometer and a method of operating the same.

BACKGROUND ART

An ionization using a plasma of corona discharge, glow discharge or the like is widely used in mass spectrometry in various fields. An explanation will be given as follows of how the ionization by the plasma has been carried out until this time.

Patent Literature 1 describes a method of carrying out an ionization by an atmospheric pressure chemical ionization method. According to the atmospheric pressure chemical ionization method, the ionization is carried out by corona discharge under an atmospheric pressure. A sample molecule is ionized by an ion molecular reaction with a primary ion which is generated by the corona discharge.

Patent Literature 2 describes a method of carrying out an ionization by glow discharge by introducing a sample into a vacuum chamber. A pressure in the vacuum chamber for carrying out the ionization is about 0.1 through 1 Torr ($1 \times 10$ through $1 \times 10^2$ Pa).

Patent Literature 3 describes a method of carrying out an ionization by a dielectric barrier discharge under an atmospheric pressure. In the dielectric barrier discharge, a low temperature plasma is generated by preventing an elevation of a temperature of a neutral gas or an ion in the plasma by interposing a dielectric between electrodes. According to Patent Literature 3, the plasma which is ejected from a probe under the atmospheric pressure is directly impinged on a sample to thereby carry out the ionization, and a generated ion is introduced to a mass spectrometer.

Nonpatent Literature 1 describes a method of carrying out an ionization by a dielectric barrier discharge which uses helium as a discharge gas in vacuum. According to the method described in Nonpatent Literature 1, a sample and helium are introduced into a vacuum chamber of a mass spectrometer by passing a capillary of a dielectric, and the sample is ionized by the dielectric barrier discharge at a vicinity of an outlet of the capillary on a side of the vacuum chamber. A flow rate of the gas which is introduced into the vacuum chamber is 25 ml/min, and a pumping speed of a pump which extracts the gas from the vacuum chamber is 300 L/s. Therefore, the vacuum chamber and the vicinity of the outlet of the capillary on the side of the vacuum chamber where the ionization occurs are maintained under a high degree of vacuum. There is strongly observed an atom ion which is produced by dissociating a molecule ion under a condition of Nonpatent Literature 1.

CITATION LIST

Patent Literatures

Patent Literature 1: U.S. Pat. No. 7,064,320
Patent Literature 2: U.S. Pat. No. 4,849,628
Patent Literature 3: WO2009/102766

Nonpatent Literature

Nonpatent Literature 1: Analytical chemistry, 1998,70,513-518

SUMMARY OF INVENTION

Technical Problem

According to the atmospheric pressure chemical ionization described in Patent Literature 1, the ion which is generated under the atmospheric pressure is introduced to the mass spectrometer by passing the ion through an orifice or a capillary. Therefore, there poses a problem that a loss of ion occurs when the ion passes through the orifice or the capillary. Furthermore, there also poses a problem that a density of charged particles of the corona discharge which is used in the atmospheric pressure chemical ionization is lower than that of other plasmas, and therefore, a number of ions generated is small.

According to the ionization by the glow discharge under a reduced pressure which is described in Patent Literature 2 and Nonpatent Literature 1, there poses a problem that fragmentation of molecule ions occurs. When the fragmentation occurs, a mass spectrum becomes complicated, and it is difficult to analyze the spectrum.

According to the ionization method which uses the dielectric barrier discharge under the atmospheric pressure described in Patent Literature 3, similar to a case of an ionization source of the atmospheric pressure chemical ionization, the generated ion is introduced to the vacuum chamber by passing an orifice or a capillary, and therefore, there poses a problem that a sensitivity is low.

According to the method described in Nonpatent Literature 1, the fragmentation of ions is considerably promoted. However, Nonpatent Literature 1 does not describe a method of restraining the fragmentation.

Solution to Problem

In order to resolve the problem described above, there is provided an example of a mass spectrometer according to the present invention which includes a first electrode, a second electrode, a dielectric portion provided between the first electrode and the second electrode and having an introducing portion and an extracting portion of a sample, a power source of superimposing an alternating current voltage on one of the first electrode and the second electrode and ionizing the sample by a discharge generated between the first electrode and the second electrode, and a mass analyzing portion of analyzing an ion extracted from an extracting portion, the mass spectrometer being featured in that the discharge is carried out at 2 Torr or higher and 300 Torr or lower.

There is provided other example of a mass spectrometer which is featured in including a first electrode, a second electrode, a dielectric portion provided between the first electrode and the second electrode and having an introducing portion and an extracting portion of a sample, a power source of superimposing an alternating current voltage at a frequency equal to or higher than 1 and equal to or lower than 300 kHz on one of the first electrode and the second electrode and ionizing the sample by a discharge generated between the first electrode and the second electrode, and a mass analyzing portion of analyzing an ion extracted from the extracting portion.

There is provided other example of a mass spectrometer which includes a first chamber including a first electrode, a second electrode, a dielectric portion provided between the first electrode and the second electrode, and an introducing portion and an extracting portion of a sample, a power source of superimposing an alternating current voltage on one of the first electrode and the second electrode and ionizing the sample by a discharge generated between the first electrode and the second electrode, and a second chamber including a mass spectrometer of analyzing an ion of the sample extracted from the extracting portion, the mass spectrometer being featured in that a pressure of the first chamber is higher than a pressure of the second chamber.

Advantageous Effects of Invention

According to the present invention, an ionization with inconsiderable fragmentation is realized highly sensitively.

BRIEF DESCRIPTION OF DRAWINGS

FIG. 2 shows an ionization source of the first embodiment.
FIG. 4 shows an ionization source of the first embodiment.
FIG. 9 shows an ionization source of a third embodiment.
FIG. 10 shows an ionization source of the third embodiment.
FIG. 12 shows a reduced pressure chamber of the fourth embodiment.
FIG. 13 shows a reduced pressure chamber of the fourth embodiment.
FIG. 14 shows a reduced pressure chamber of the fourth embodiment.

DESCRIPTION OF EMBODIMENTS

First Embodiment

Figure 1:
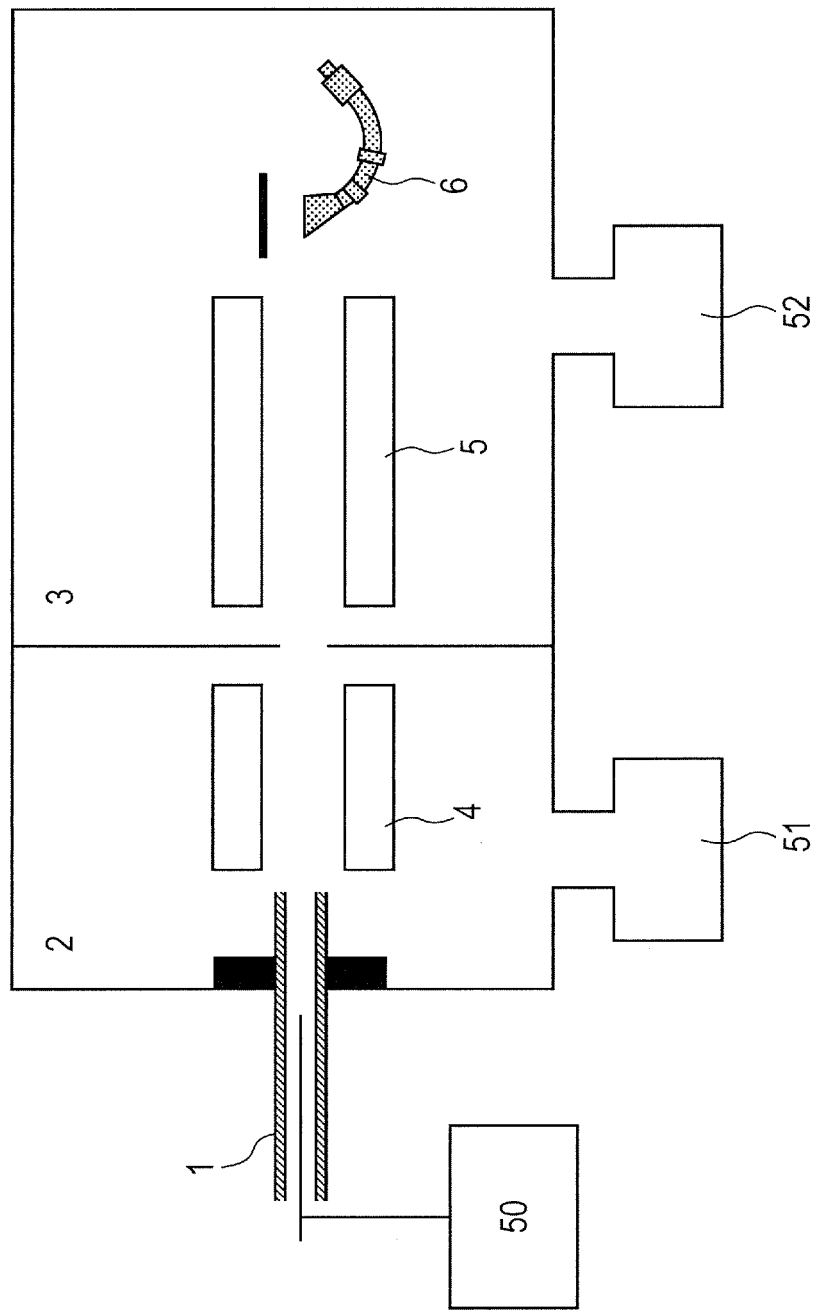
FIG. 1 is a device configuring view of a first embodiment.

FIG. 1 is a configuring view showing an embodiment of a mass spectrometer according to the present invention. A sample is introduced from an inlet of a capillary of an ionization source 1 along with air under an atmospheric pressure. The sample can also be mixed with a gas of nitrogen, helium, argon or the like other than air to be introduced into the capillary. When the capillary is heated, the sample or foreign matters can be prevented from being adsorbed to an inner wall of the capillary. An ion which is generated by the ionization source 1 is introduced into a first differential pumping chamber 2 of a vacuum chamber. The first differential pumping chamber 2 is maintained at about 1 through $1.0 \times 10^4$ Pa by exhausting the gas by a vacuum pump 51 of a rotary pump, a diaphragm pump or the like. The ion which is introduced into the first differential pumping chamber 2 is made to converge by a multipole ion guide 4, and is introduced into a second differential pumping chamber 3. The second differential pumping chamber 3 is maintained at about $10^{-4}$ Torr through $10^{-2}$ Torr (33 $10^{-2}$ Pa through 1 Pa) by exhausting the gas by a vacuum pump 52. A mass spectrometry unit 5 and a detector 6 are installed in the second differential pumping chamber 3. Ions which are introduced into the second differential pumping chamber 3 are selected for respective m/z by the mass spectrometry unit 5 of a quadrupole mass filter, an ion trap, a time-of-flight mass spectrometer or the like, and are detected by the detector 6 of an electron multiplier tube or the like. FT-ICR or the like may be used instead of the mass spectrometry unit 5 and the detector 6.

FIG. 2 shows a configuring view of the ionization source 1. (B) is a view viewing from a direction b of (A). The ionization source 1 consists of a dielectric capillary 10 which is configured by a dielectric of glass, plastic, ceramic, resin or the like, a first discharge electrode 11 which is inserted to an inner portion of the dielectric capillary, and a second discharge electrode 12 which is provided at an outer portion of the dielectric capillary. A dielectric barrier discharge is brought about between the second discharge electrode 12 and the first discharge electrode 11 via the dielectric capillary 10, and a plasma 100 is generated at an area which is interposed by the second discharge electrode 12 and the first discharge electrode 11. When a large discharge current flows substantially continuously in discharging, a plasma temperature is elevated and a fragmentation is easy to occur. However, the dielectric which is disposed between the discharge electrodes is operated as a capacitor in the dielectric barrier discharge. It can therefore be prevented that the discharge current flows continuously and the plasma temperature is elevated. In FIG. 2(B), the second discharge electrode 12 is arranged to be shifted from a center axis of the dielectric capillary 10. Thereby, the first and the second discharge electrodes are further proximate to each other. Therefore, there is achieved an effect that the discharge is easy to be started.

Figure 8:
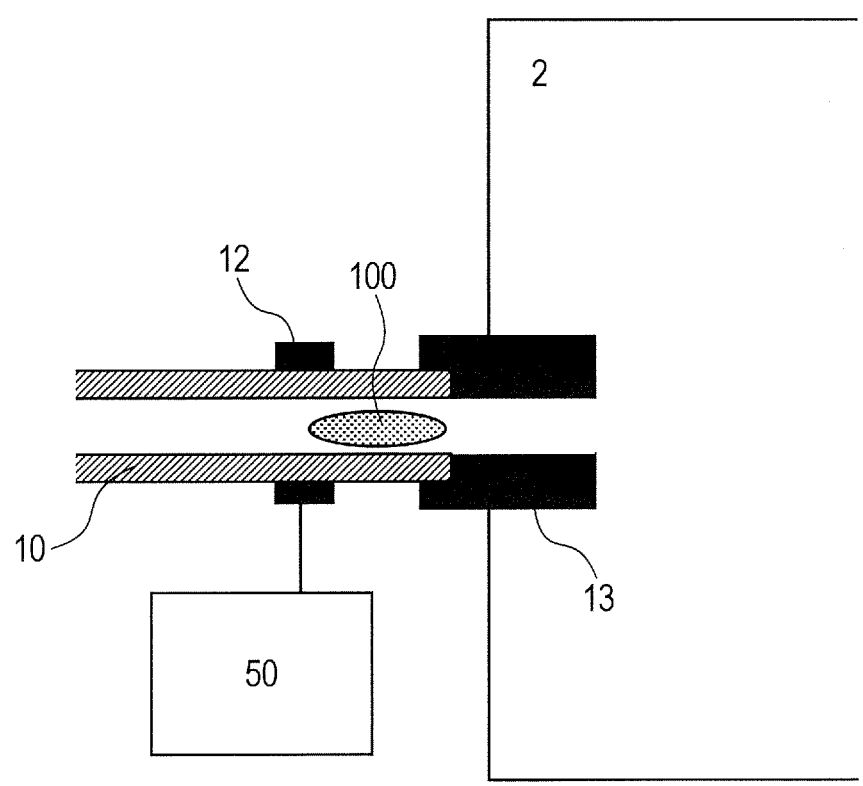
FIG. 8 shows an ionization source of the first embodiment.

The first discharge electrode may be a wire electrode as shown in FIG. 1, or a cylindrical electrode as shown in FIG. 4. Or, as shown in FIG. 8, the dielectric capillary 10 and a conductor capillary 13 may be connected and the conductor capillary 13 may be used as the first discharge electrode. When the conductor capillary 13 is used, the capillary can be prevented from being charged up by the ion that is generated at the ionization source. On the other hand, a structure thereof becomes complicated since the capillaries having different materials are connected at a midway.

Although the materials of the first and the second discharge electrodes 11 and 12 and the conductor capillary 13 may be conductors, the service life of the electrodes is prolonged when the material uses a metal which is strong at corrosion of gold or the like.

The second discharge electrode 12 may only be brought into contact with a portion of an outer side of the dielectric capillary 10. However, the discharge occurs uniformly in a diameter direction of the dielectric capillary 10 by a structure in which the second discharge electrode 12 is brought into contact with a total of the dielectric capillary 10 as shown in FIG. 2. Therefore, the sample can efficiently be ionized.

An inner diameter of the dielectric capillary is typically 10 um through 1 cm, and a length thereof is typically about 0.1 through 1 m. The shorter the length of the dielectric capillary, and the larger the inner diameter, the more increased the conductance of the dielectric capillary, and the more increased the amount of a gas which is introduced to the mass spectrometer per constant period of time. The larger the conductance, the more increased the sensitivity of the mass spectrometer. On the other hand, the smaller the conductance, the more reduced the pumping speed of a pump which is necessary for maintaining the pressure of the second differential pumping portion 3 equal to or lower than an operable pressure of the mass spectrometry unit 5 and the detector 6, and a small-sized pump can be used.

Figure 3:
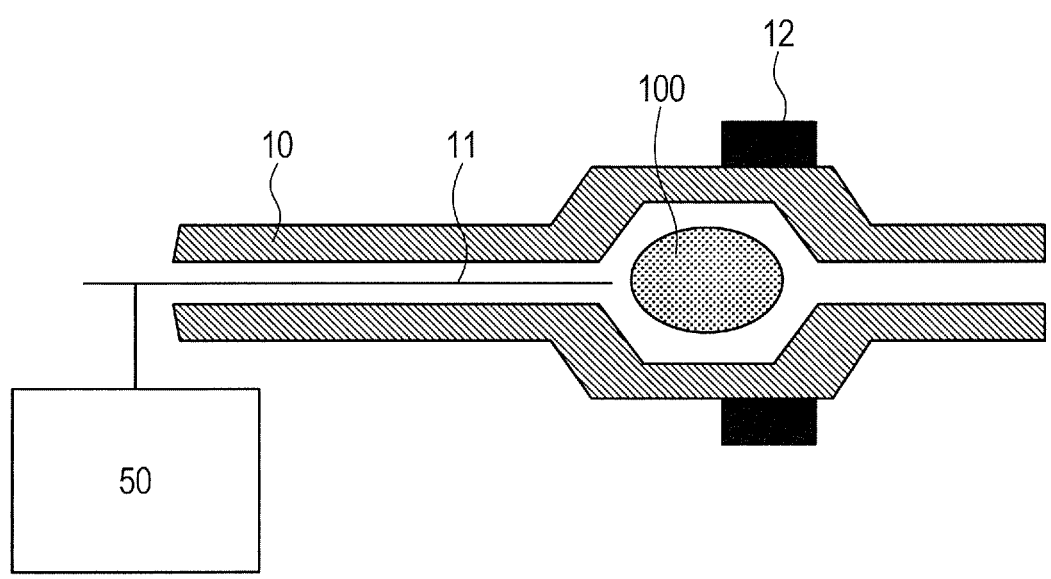
FIG. 3 shows an ionization source of the first embodiment.

There may be used a capillary in which an inner diameter of the capillary is changed at a midway as shown in FIG. 3. Here, when the inner diameter of the plasma is increased in an area where the plasma is generated, a time period during which an ion dwells in the plasma is prolonged, and an ion molecular reaction is easy to occur.

The shortest distance between the first discharge electrode 11 and the second discharge electrode 12 is typically about $1 \times 10^{-4}$ through $1 \times 10^{-1}$ m. The longer the distance between the first discharge electrode 11 and the second discharge electrode 12, the longer the time period during which a sample molecule exists in the plasma and the easier the ion molecule reaction occurs. On the other hand, the longer the distance between the first discharge electrode 11 and the second discharge electrode 12, the higher the voltage necessary for the discharge.

Figure 5:
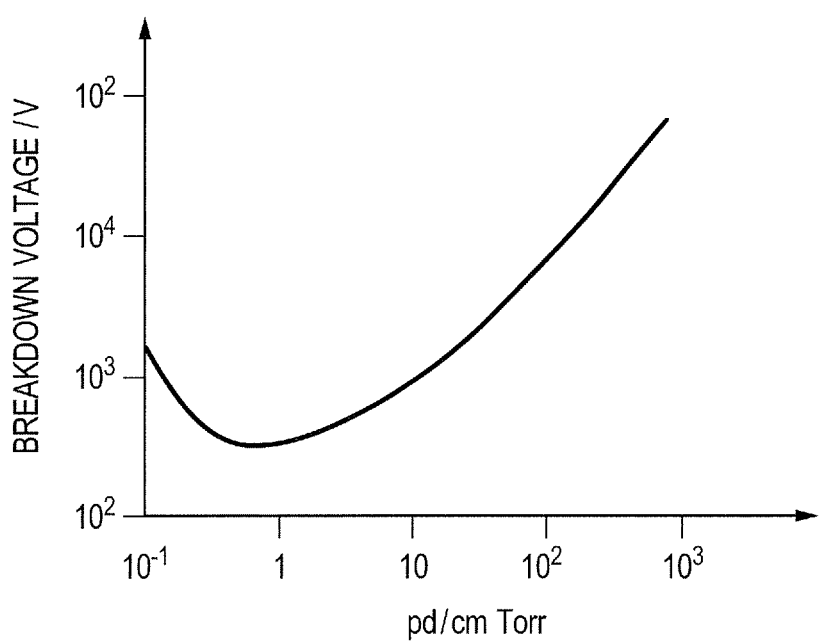
FIG. 5 is an explanatory view of an effect.

FIG. 5 shows a relationship between a break down voltage and a product of a pressure by a distance between discharge electrodes (pd product) with regard to air. The break down voltage becomes a minimum at a vicinity of 0.5 cm Torr, thereafter, the larger the pd product, the more increased the break down voltage. In a case where a discharge gas is air and a pressure thereof is 10 Torr ($1.3 \times 10^3$ Pa), the discharge voltage is 1 kV at the distance between electrodes of 1 cm and about 4 kV at the distance between electrodes of 5 cm.

An AC voltage is superimposed from a power supply 50 on one of the first discharge electrode 11 and the second discharge electrode 12, and a DC voltage is superimposed on the other. The other electrode may be grounded instead of superimposing the DC voltage on the other electrode. Although in the following embodiments, a description is given in a case where an AC voltage is superimposed on the first discharge electrode 11, a similar effect can be achieved even in a case where the DC voltage (or the ground) is superimposed on the first discharge electrode 11, and the AC voltage is superimposed on the second discharge electrode 11.

The AC voltage generated at the power supply 50 may be of a rectangular wave or a sine wave. Typically, the superimposed voltage falls in a range of 0.5 through 10 kV and a frequency falls in a range of 1 through 300 kHz. Under a condition of a high frequency (100 through 300 kHz), a density of the plasma is increased, and therefore, although an ionization efficiency is high, the fragmentation is easy to occur. On the other hand, under a condition of a low frequency (1 through 20 kHz), the fragmentation is difficult to occur and also a molecule ion which is easy to be destructed can be detected. However, the ionization efficiency is lower than that in the case of the high frequency. Under a condition where the frequency falls in a range of 20 through 100 kHz, an intermediate property is shown.

When an amplitude of the voltage stays the same, the density of the plasma is higher in a case of using the rectangular wave. On the other hand, in a case of a high frequency, the voltage can be amplified by a coil in the sine wave. Therefore, there is achieved an advantage that the power supply is inexpensive. The frequency and the voltage of the AC voltage may be changed for respective ions of samples or measurement objects. For example, an inputted power is made to be high in a case of measuring a molecule which is difficult to cause the fragmentation as in an inorganic substance ion or a case of measuring a fragment ion, and the inputted power is made to be low in a case of measuring a molecule ion which is easy to cause the fragmentation. Also, power consumption of the power supply 50 can be restrained when the power is controlled by providing a control mechanism of switching the voltage over time such that the ionization is carried out by superimposing the AC voltage only during a time period in which a sample is introduced, and the AC voltage is not superimposed during a time period in which the sample is not introduced.

Figure 6:
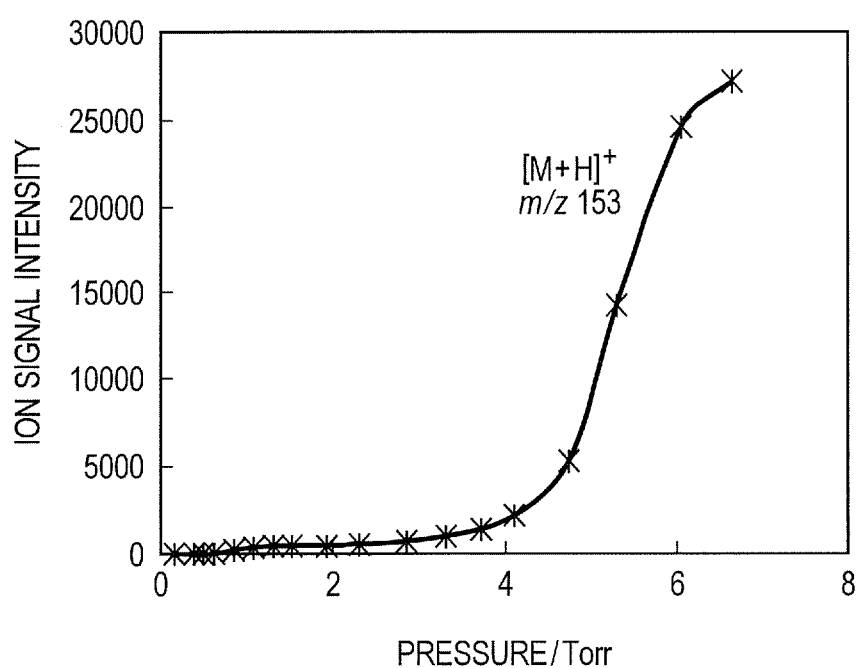
FIG. 6 is an explanatory view of an effect.

According to the present invention, the ionization can be carried out highly sensitively while restraining the fragmentation by generating the plasma under a reduced pressure equal to or higher than 2 Torr and equal to or lower than 300 Torr. When a pressure at a region of generating the plasma is higher than 300 Torr, the voltage which is necessary for starting the discharge becomes high, and there is a possibility of effecting an influence on generating the plasma. However, the stable plasma can be generated by making the pressure equal to or lower than 300 Torr. FIG. 6 shows a result of ionizing methyl salicylate by the configuration of the present embodiment and plotting a pressure dependence of a signal intensity of an ion which is observed. The discharge gas is air, and a rectangular wave voltage superimposed on the first discharge electrode 11 is 2 $kV_{0\text{-}peak}$ at 15 kHz. A signal intensity of a protonated ion of methyl salicylate ([M+H]+, m/z 153) is increased at 4 Torr or higher and is finally saturated. It seems that this is because the higher the pressure of the discharge gas, the easier the ion-molecule reaction occurs. The sensitivity of the molecule ion of the sample is low at 2 Torr through 4 Torr. However, an amount of primary ions is larger than an amount of the sample molecule. Therefore, there is achieved an advantage that an influence of ion suppression is difficult to be effected. On the other hand, at 7 Torr or higher, the molecule ion of the sample can be detected highly sensitively. At 4 through 7 Torr, an intermediate property thereof is shown. At 2 Torr or lower, a molecule ion originated from methyl salicylate of a protonated ion or the like is hardly observed. This is because when the pressure of the discharge gas is low, a probability of impinging a high energy electron directly on the sample molecule is high, and the fragmentation is easy to occur.

A pressure at an inlet of the dielectric capillary 10 is the atmospheric pressure, and a pressure at an outlet thereof is a pressure of the first differential pumping chamber 2. Therefore, there is present a pressure gradient in an axial direction of the capillary. Therefore, a pressure at an area of generating the plasma can be adjusted by selecting a position of the area of generating the plasma 100 in the axial direction of the capillary. At this occasion, the smaller the pressure difference between the area of generating the plasma and the first differential pumping chamber 2, the larger the conductance between the region of generating the plasma and the first differential pumping chamber 2 can be made. The larger the conductance, the more the loss of ions by an influence of the space charge or a collision to the inner wall of the tube can be restrained, and an efficiency of introducing the ion to the first differential pumping chamber 2 is increased.

According to the present invention, the sample gas passes from the inlet of the capillary to the area of generating the plasma 100 in a state of a neutral gas. Therefore, the loss of ions by the influence of the space charge or the collision to the inner wall of the tube can be restrained, and the sample can be introduced into vacuum with a high efficiency. Also, the plasma is generated in a small area, and therefore, the plasma having the high density can be generated with low power consumption. According to the present invention, the fragmentation can be restrained while maintaining the stable discharge.

Second Embodiment

Figure 7:
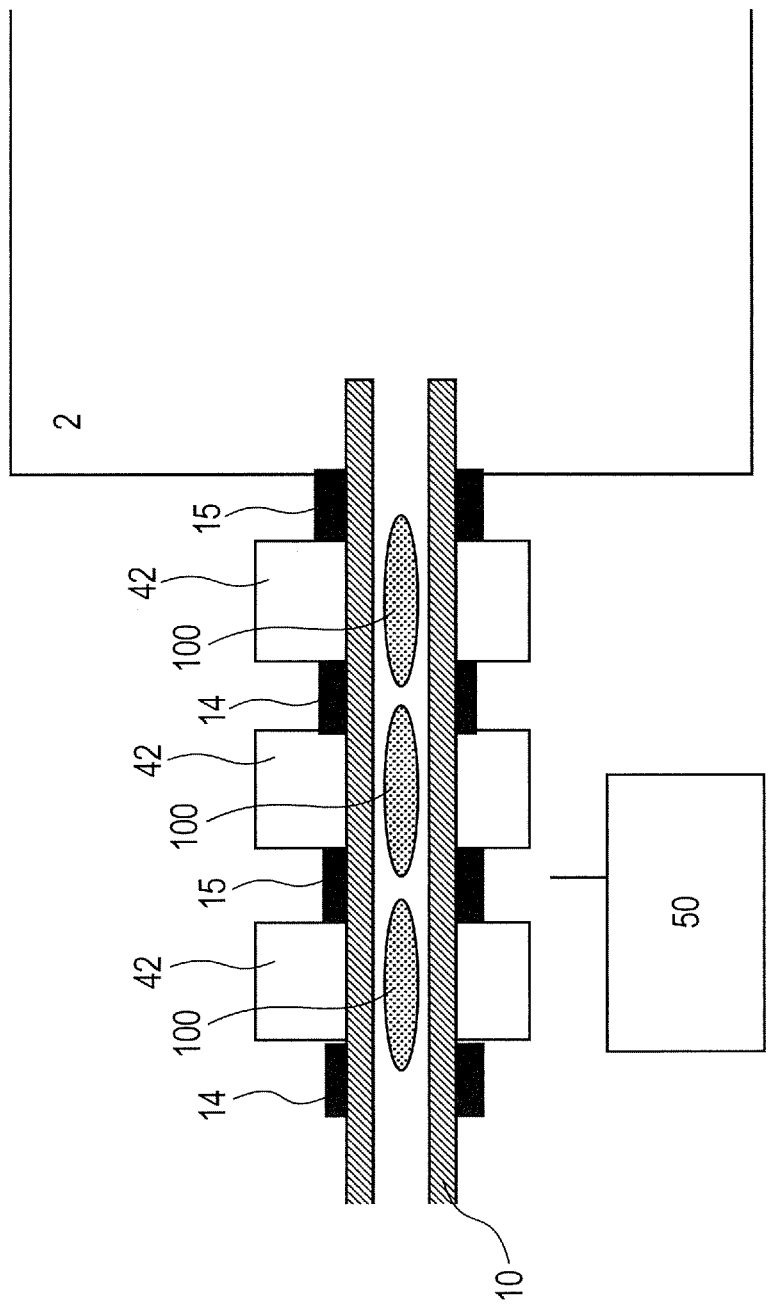
FIG. 7 shows an ionization source of a second embodiment.

FIG. 7 is a configuring view showing an embodiment of a mass spectrometer according to the present invention. A configuration other than the ionization source 1 is similar to that of the first embodiment and an explanation thereof will be omitted. Also, an effect of a pressure at an area where the plasma 100 is generated, and an output voltage of the power source 50 are similar to those of the first embodiment. The ionization source 1 is configured by the dielectric capillary 10 and two sheets or more of discharge electrodes 14 and 15. The discharge electrodes 14 and 15 are arranged to surround an outer side of the dielectric capillary 10. There are alternately arranged the first discharge electrodes 14 which are superimposed with an AC voltage from the power source 50 and the second discharge electrodes which are superimposed with a DC voltage therefrom. Conversely, the first discharge electrode 14 may be superimposed with the DC voltage and the second discharge electrode 15 may be superimposed with the AC voltage. Also, the discharge electrode may be grounded instead of superimposing the DC voltage thereon. The dielectric barrier discharge is caused between the first discharge electrode 14 and the second discharge electrode 15 by way of the dielectric capillary 10, and the plasma 100 is generated at an area between the first discharge electrode 14 and the second discharge electrode 15. An insulator 42 may be inserted between the first discharge electrode 14 and the second discharge electrode 15 in order to prevent a discharge on the outer side of the dielectric capillary 10. The discharge between the discharge electrodes 14 and 15 on the outer side of the capillary is difficult to be caused by installing the first discharge electrode 14 and the second discharge electrode 15 in the atmosphere. This is because in the air, the discharge voltage becomes high under an atmospheric pressure in view of the relationship of FIG. 5.

Different from the configuration of the first embodiment, it is not necessary to put the electrode at inside of the capillary where the sample passes. Therefore, a contamination of adhering the sample to the electrode or the like can be avoided. Also, a length of an area where the plasma is generated can be adjusted by changing numbers of the discharge electrodes while maintaining distances among the electrodes.

Third Embodiment

FIG. 9 is a configuring view showing an embodiment of a mass spectrometer according to the present invention. (B) of the drawing is a view viewing (A) from a direction b. The configuration other than the ionization source 1 is similar to that of the first embodiment and an explanation thereof will be omitted. Also, the effect of the pressure of the area where the plasma 100 is generated and the output voltage of the power source 50 are similar to those of the first embodiment. The ionization source 1 is configured by the dielectric capillary 10, a first discharge electrode 40, and a second discharge electrode 41. One of the first discharge electrode 40 and the second discharge electrode 41 is supplied with an AC voltage from the power source 50, and the other is superimposed with a DC voltage or the grounded. A dielectric barrier discharge is caused between the first discharge electrode 40 and the second discharge electrode 41 by way of the dielectric capillary 10, and a plasma is generated at the region 100. The first discharge electrode 40 and the second discharge electrode 41 may be arranged on an inner side and an outer side of the dielectric capillary as shown in FIG. 9 or may be arranged on the outer side of the capillary as shown in FIG. 10. An insulator may be inserted between the electrodes in order to prevent a discharge.

In comparison with the configuration of the first embodiment, the discharging electrodes are arranged such that a distance between the discharge electrodes stays constant without depending on a position in an axial direction of the capillary. Therefore, the plasma which is uniform in the axial direction can be configured. Also, when lengths of the first discharge electrode 40 and the second discharge electrodes 41 in the axial direction of the dielectric capillary are changed, a length of an area where the plasma is generated can be changed.

Fourth Embodiment

Figure 11:
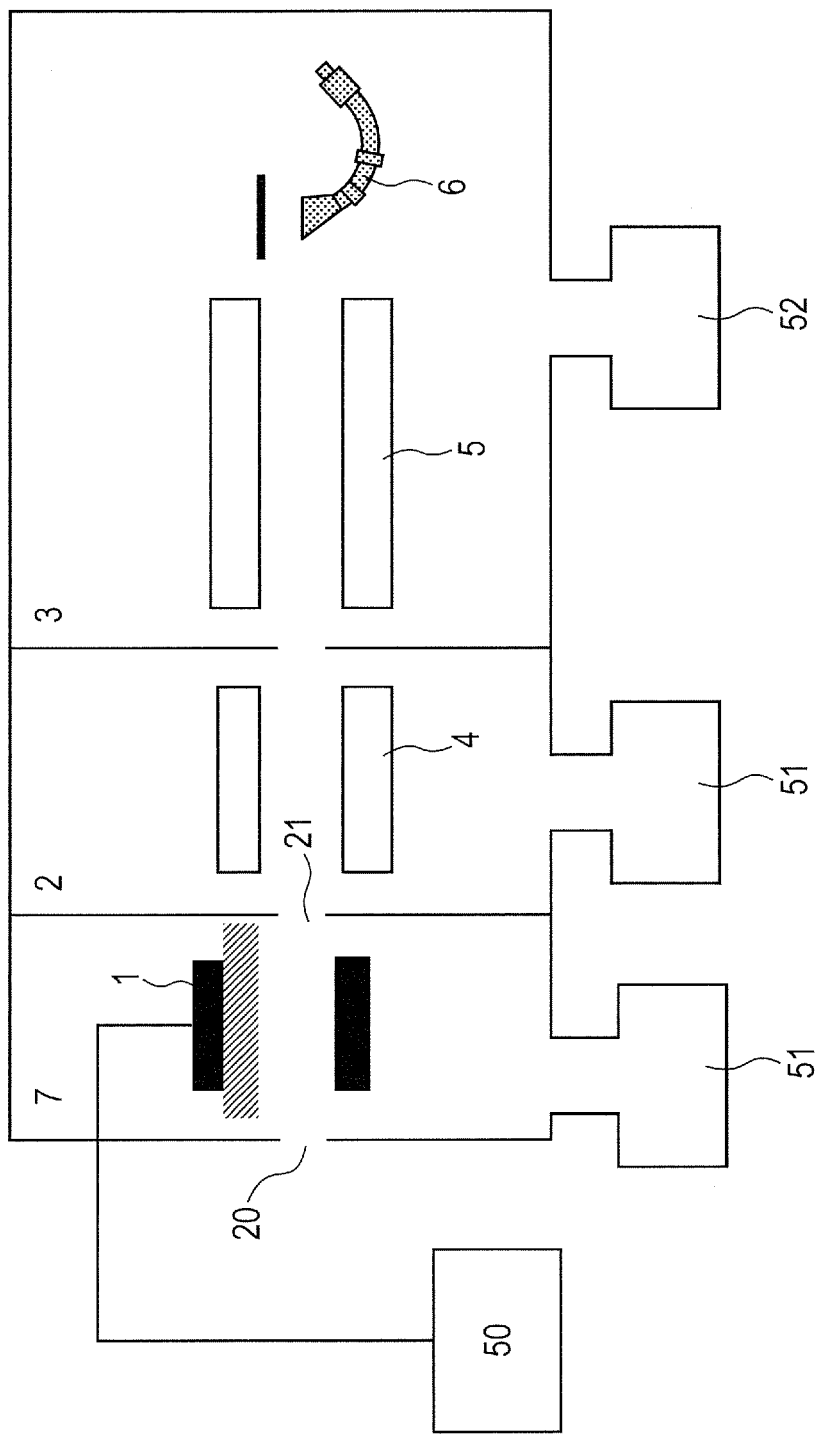
FIG. 11 is a device configuring view of a fourth embodiment.

FIG. 11 is a configuring view showing an embodiment of the mass spectrometer according to the present invention. A neutral sample gas is introduced to a reduced pressure chamber 7 by passing an orifice 20. The reduced pressure chamber 7 is maintained under a reduced pressure condition of 5 Torr or higher, and a plasma is generated by using a dielectric barrier discharge at inside of the reduced pressure chamber. The reduced pressure chamber 7 may be vacuumed by a vacuum pump 53.

The sample ion which is ionized at inside of the reduced pressure chamber is introduced from the first differential pumping chamber 2 by passing an orifice 21. The smaller the pressure difference between the reduced pressure chamber 7 and the first differential pumping chamber 2, the larger the conductance of the orifice 21 can be made. The larger the conductance, the higher the efficiency of introducing ions into the first differential pumping chamber 2. The effect of the pressure of the area where the plasma 100 is generated and the output voltage of the power source 50 are similar to those of the first embodiment.

FIGS. 12, 13, and 14 show configuration views of the reduced pressure chamber 7. In FIG. 12, the reduced pressure chamber 7 is configured by the first discharge electrode 11 and the second discharge electrode 12 of flat plates, and a dielectric 22. One of the first discharge electrode 11 and the second discharge electrode 12 is supplied with an AC voltage from the power source 50, and the other is superimposed with a DC voltage therefrom or grounded. The plasma 100 is generated at an area between the dielectric 22 and the second discharge electrode 12. When the dielectric 22 is made to be sufficiently larger than the first discharge electrode 11, it can be prevented that a discharge is generated between the first discharge electrode 11 and the second discharge electrode 12 without interposing the dielectric 22 therebetween.

In FIG. 13, the reduced pressure chamber 7 is configured by the first discharge electrode 11 and the dielectric 22 of flat plates, and an electrode 24 in a rod-like shape or a net-like shape as the second discharge electrode. FIG. 13(b) is a view viewing from a direction b of (A). The first discharge electrode 11 is supplied with an AC voltage from the power source 50, and the electrode 24 is supplied with a DC voltage. In a converse case, the second discharge electrode 24 is supplied with an AC voltage from the power source 50 and the first discharge electrode 11 is supplied with a DC voltage. The electrode may be grounded instead of being supplied with a DC voltage. A plasma is generated at the region 100 between the dielectric 22 and the electrode 24. An ion, a low speed electron, or an excited state molecule which is generated at the region 100 of the plasma is diffused to an area of impinging on a sample molecule to thereby ionize the sample. The sample does not pass the plasma area having a high charged particle density. Therefore, although an efficiency of ionization becomes low, the sample is difficult to impinge on an electron having a high energy. Therefore, the fragmentation can be restrained.

In FIG. 14, the reduced pressure chamber 7 is configured by the dielectric 22 in a column-like shape, the first discharge electrode 11 which is brought into contact therewith, and the second discharge electrode 12 in a rod-like shape. A plasma is generated between the second discharge electrode 12 and the dielectric 22. When center axes of the second discharge electrode 12 and the dielectric 22 are shifted from each other, the discharge is started at a point at which a distance between the first discharge electrode 1 and the second discharge electrode is short. A discharge is started also at other area by charged particles generated at the point. Therefore, a voltage by which the discharge starts can be lowered.

In a case of carrying out an ionization in the reduced pressure chamber 7, a flow speed of the sample gas becomes smaller than that in a case of an ionization at inside of the capillary as in the first embodiment. Therefore, an efficiency of the ionization by an ion-molecule reaction is increased. On the other hand, a volume of an area where the plasma is generated is increased. Therefore, an input power which is necessary for generating a plasma of the same density is increased.

Fifth Embodiment

Figure 15:
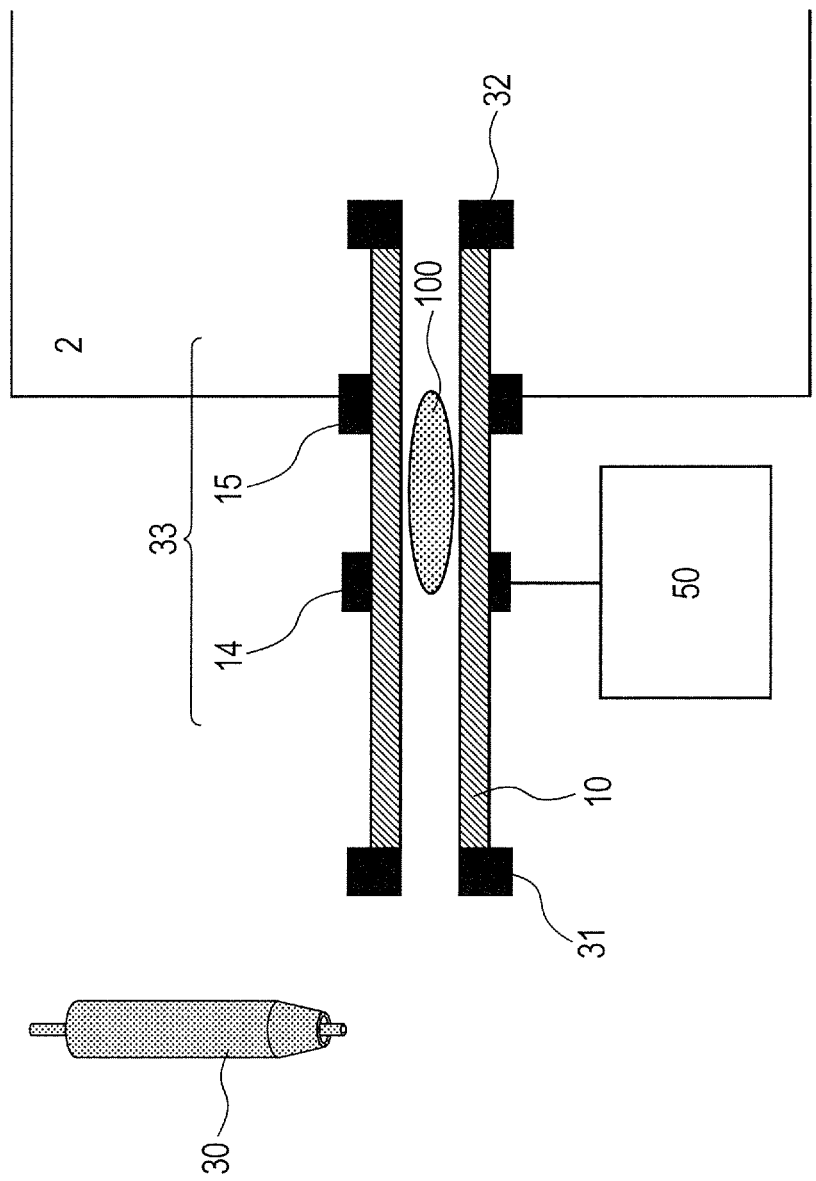
FIG. 15 shows an ionization source of a fifth embodiment.

FIG. 15 is a configuring view showing an embodiment of a mass spectrometer according to the present invention. The configuration other than the ionization source is similar to that of the first embodiment and an explanation thereof will be omitted. Also, the effect of the pressure at the area where the plasma 100 is generated, and the output voltage of the power source 50 are similar to those of the first embodiment. A sample solution which is supplied to an ESI probe 30 is ionized by an electrospray ionization (ESI).

An ion and a charged droplet which are generated by the electrospray ionization are introduced to the dielectric capillary 10 by passing an inlet end electrode 31. The dielectric capillary 10 is heated to promote separation of a solvent molecule from the charged droplet. A neutral vapor and a portion of neutral molecules which are separated from the charged droplet which are introduced into the dielectric capillary 10 are ionized at a plasma ionization source portion 33. Ions which are generated by ESI and ions which are generated by the plasma ionization source portion 33 are extracted by passing an outlet end electrode and are introduced to an ion optics system at a later stage.

The ESI probe is applied with a voltage of about 1 through 10 kV in a case of measuring a positive ion and about −1 through −10 kV in a case of measuring a negative ion. When a voltage having a polarity inverse to that of an ion is superimposed on the inlet end electrode 31, the ion which is generated by ESI can be introduced to the capillary further efficiently. When a DC voltage is applied to the outlet end electrode 32, the ion is easy to be introduced to the ion optics system at the later stage.

According to the present embodiment, in comparison with a general ionization source of only electrospray ionization, a sample which has not been ionized by the electrospray ionization can be ionized by the plasma ion source 33. Therefore, a higher sensitivity is achieved. Also, even a molecule having a low polarity or an intermediate polarity which is difficult to be ionized by ESI in a plasma can directly be ionized.

When a temperature of a discharge gas is elevated by setting a voltage inputted to the power source 50 to be high during a time period other than a measurement time period, an impurity which is adhered to an inner wall of the dielectric capillary 10 can be removed by heating inside of the dielectric capillary 10 commonly to the other embodiments.

LIST OF REFERENCE SIGNS

1 . . . ionization source, 2 . . . first differential pumping chamber, 3 . . . second differential pumping chamber, 4 . . . multipole ion guide, 5 . . . mass spectrometry unit, 6 . . . detector, 7 . . . reduced pressure chamber, 10 . . . dielectric capillary, 11 . . . first discharge electrode, 12 . . . second discharge electrode, 13 . . . dielectric capillary, 14 . . . first discharge electrode, 15 . . . second discharge electrode, 20 . . . orifice, 21 . . . orifice, 22 . . . dielectric, 24 . . . discharge electrode, 30 . . . ESI probe, 31 . . . inlet end electrode, 32 . . . outlet end electrode, 33 . . . plasma ion source portion, 40 . . . first discharge electrode, 41 . . . second discharge electrode, 42 . . . insulator, 50 . . . ionization source power supply, 51 . . . vacuum pump, 52 . . . vacuum pump, 53 . . . vacuum pump, 100 . . . plasma

The invention claimed is:

1. A mass spectrometer comprising:
a first electrode;
a second electrode;
a dielectric portion provided between the first electrode and the second electrode, the dielectric portion configured in a shape of a cylinder, the first electrode provided at an inside of the cylinder, and the second electrode provided at an outside of the cylinder and spaced apart from the first electrode along the longitudinal axis of the dielectric portion, the dielectric portion having:
an introducing portion placed under atmospheric pressure, and
an extracting portion configured to extract a portion of a sample placed in a vacuum pumped chamber,
a power source configured to superimpose an alternating current voltage on one of the first electrode and the second electrode, and configured to ionize the sample by a dielectric barrier discharge generated between the first electrode and the second electrode at a region of the dielectric portion having a pressure greater than or equal to 2 Torr and less than or equal to 300 Torr; and
a mass analyzing portion configured to analyze an ion extracted from the extracting portion.

2. The mass spectrometer according to claim 1, wherein the dielectric barrier discharge is carried out at a pressure greater than or equal to 4 Torr.

3. The mass spectrometry according to claim 1, wherein the dielectric barrier discharge is carried out at a pressure greater than or equal to 7 Torr.

4. The mass spectrometry according to claim 1, wherein the power source is configured to superimpose a direct current voltage on the electrode of the first electrode and the second electrode which is not applied with the alternating current voltage.

5. The mass spectrometer according to claim 1, wherein the first electrode is configured in an electrode in a shape of a wire, and the second electrode is provided on a side of the extracting portion of the sample in the shape of the wire.

6. The mass spectrometer according to claim 1, wherein an inner diameter of the cylinder at a portion configured to carry out discharge is larger than an inner diameter of the other portion.

7. The mass spectrometer according to claim 1 wherein the first electrode is provided to cover the inside of the cylinder.

8. The mass spectrometer according to claim 1, wherein a gas existing at the dielectric portion is air.

9. The mass spectrometer according to claim 1, further comprising:
an ionization portion for extracting a charged droplet and an ion of a sample solution on a side of the introducing portion of the sample;
wherein the dielectric portion is heated.

10. The mass spectrometer according to claim 1, wherein wherein the dielectric barrier discharge is carried out at a pressure greater than 100 Torr and less than or equal to 300 Torr.

11. A mass spectrometer comprising:

a first electrode;

a second electrode;

a dielectric portion provided between the first electrode and the second electrode, the dielectric portion configured in a shape of a cylinder, the first electrode provided at an inside of the cylinder, and the second electrode provided at an outside of the cylinder and spaced apart from the first electrode along the longitudinal axis of the dielectric portion, the dielectric portion having:

an introducing portion placed under atmospheric pressure, and an extracting portion configured to extract a portion of a sample placed in a vacuum pumped chamber, a power source of configured to superimpose an alternating current voltage at a frequency greater than or equal to 1 kHz and less than or equal to 300 kHz on one of the first electrode and the second electrode, and configured to ionize the sample by a dielectric barrier discharge generated between the first electrode and the second electrode at a region of the dielectric portion having a pressure greater than or equal to 2 Torr and less than or equal to 300 Torr; and a mass analyzing portion configured to analyze an ion extracted from the extracting portion.

12. The mass spectrometer according to claim 11, wherein the frequency is greater than or equal to 1 kHz and less than or equal to 20 kHz.

13. The mass spectrometer according to claim 11, wherein the alternating current voltage is of a rectangular wave.

14. The mass spectrometer according to claim 11, wherein the alternating current voltage is of a sine wave.

15. The mass spectrometer according to claim 11, wherein wherein the dielectric barrier discharge is carried out at a pressure greater than 100 Torr and less than or equal to 300 Torr.

16. The mass spectrometer according to claim 11, wherein the first electrode is configured in a shape of a wire, and the second electrode is provided on a side of the extracting portion of the sample.

17. The mass spectrometer according to claim 11, wherein an inner diameter of the cylinder at a portion configured to carry out discharge is larger than an inner diameter of the other portion.

18. The mass spectrometer according to claim 11, wherein the first electrode is provided to cover at least a portion of the inside of the cylinder.

* * * * *